United States Patent
Huang et al.

(10) Patent No.: US 10,714,958 B2
(45) Date of Patent: Jul. 14, 2020

(54) CHARGING APPARATUS AND OPERATING METHOD THEREOF

(71) Applicant: Chicony Power Technology Co., Ltd., New Taipei (TW)

(72) Inventors: Shuo-Kuo Huang, New Taipei (TW); Yuan-Jing Liu, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 16/153,834

(22) Filed: Oct. 8, 2018

(65) Prior Publication Data

US 2020/0059104 A1 Feb. 20, 2020

(30) Foreign Application Priority Data

Aug. 17, 2018 (CN) .......................... 2018 1 0938578

(51) Int. Cl.
*H02J 7/00* (2006.01)
*H03K 5/24* (2006.01)
*G01R 19/165* (2006.01)

(52) U.S. Cl.
CPC ........ *H02J 7/008* (2013.01); *G01R 19/16542* (2013.01); *H02J 7/00041* (2020.01); *H02J 7/0071* (2020.01); *H03K 5/24* (2013.01); *H02J 7/00043* (2020.01)

(58) Field of Classification Search
CPC .. H02J 7/00; H02J 7/008; H02J 7/0073; H02J 7/0008; H02J 7/0009; H02J 7/0071; H02J 7/00041; H02J 7/00043; H03K 5/24; G01R 19/16542; G01R 19/165
See application file for complete search history.

(56) References Cited

U.S. PATENT DOCUMENTS 5,637,981 A 6/1997 Nagai et al.
6,492,792 B1 12/2002 Johnson, Jr. et al.
(Continued)

FOREIGN PATENT DOCUMENTS

CN 107351716 11/2017
TW I336158 1/2011
(Continued)

*Primary Examiner* — Vuthe Siek
(74) *Attorney, Agent, or Firm* — JCIPRNET (57) ABSTRACT

The invention provides a charging apparatus and an operating method thereof. The charging apparatus includes a power conversion circuit, a feedback circuit, an identifier control circuit, and a low voltage trickle control circuit. The feedback circuit generates a feedback signal for the power conversion circuit, and the power conversion circuit correspondingly adjusts a charging power according to the feedback signal. The power conversion circuit provides the charging power to charge a battery device. The identifier control circuit determines whether to control the feedback circuit to change the feedback signal according to identifier information of the battery device. The low voltage trickle control circuit determines whether to control the feedback circuit to change the feedback signal according to a voltage of the charging power. When the low voltage trickle control circuit controls the feedback circuit to change the feedback signal, the feedback circuit ignores control of the identifier control circuit.

10 Claims, 3 Drawing Sheets

(56) References Cited

U.S. PATENT DOCUMENTS

| | | | |
|---|---|---|---|
| 2009/0271789 A1* | 10/2009 | Babich | G06F 9/526 |
| | | | 718/100 |
| 2011/0029703 A1 | 2/2011 | Huo et al. | |
| 2013/0162222 A1 | 6/2013 | Ke et al. | |
| 2013/0187597 A1* | 7/2013 | Eastlack | H02J 5/005 |
| | | | 320/108 |
| 2014/0145679 A1* | 5/2014 | Chen | H02M 3/1582 |
| | | | 320/128 |
| 2014/0312855 A1* | 10/2014 | Kung | H02M 3/155 |
| | | | 320/163 |
| 2015/0372513 A1* | 12/2015 | Choi | H02J 7/0003 |
| | | | 320/125 |
| 2017/0201101 A1* | 7/2017 | Yang | H02J 7/0044 |
| 2017/0373503 A1* | 12/2017 | Ledenev | H02J 3/385 |
| 2018/0233937 A1* | 8/2018 | Yang | H02J 7/0052 |

FOREIGN PATENT DOCUMENTS

| | | |
|---|---|---|
| TW | M499008 | 4/2015 |
| WO | 2017041336 | 3/2017 |

* cited by examiner

CHARGING APPARATUS AND OPERATING METHOD THEREOF

CROSS-REFERENCE TO RELATED APPLICATION

This application claims the priority benefit of China application serial no. 201810938578.X, filed on Aug. 17, 2018. The entirety of the above-mentioned patent application is hereby incorporated by reference herein and made a part of this specification.

BACKGROUND OF THE INVENTION

Field of the Invention

The disclosure relates to a charging apparatus and an operating method thereof.

Description of Related Art

The conventional charging apparatuses cannot adapt to battery devices with different specifications. In addition, when the power storage of the battery device is overly low (e.g., when the battery device is in the dead battery state), if a conventional charging apparatus charges the battery device in the normal constant voltage mode (or the normal constant current mode), the conventional charging apparatus will cause the battery device to overheat (or even damage the battery device).

SUMMARY OF THE INVENTION

The invention provides a charging apparatus and an operating method thereof that can adapt to battery devices with different specifications and can trickle charge the battery device when the power storage of the battery devices is overly low to avoid overheating or even damage to the battery devices.

An embodiment of the invention provides a charging apparatus including a power conversion circuit, a feedback circuit, an identifier control circuit, and a low voltage trickle control circuit. The power conversion circuit is configured to provide a charging power to charge a battery device. The feedback circuit is coupled to the power conversion circuit and is configured to generate a feedback signal associated with the charging power for the power conversion circuit, wherein the power conversion circuit correspondingly adjusts the charging power according to the feedback signal. The identifier control circuit is coupled to the feedback circuit and is configured to receive identifier information from the battery device and determine whether to control the feedback circuit to change the feedback signal according to the identifier information to dynamically adjust the charging power to adapt to the battery device. The low voltage trickle control circuit is coupled to the feedback circuit and the power conversion circuit and is configured to determine whether to control the feedback circuit to change the feedback signal according to a voltage of the charging power to cause the power conversion circuit to trickle charge the battery device. When the low voltage trickle control circuit controls the feedback circuit to change the feedback signal, the feedback circuit ignores control of the identifier control circuit.

An embodiment of the invention provides an operating method of a charging apparatus including the following steps. A power conversion circuit provides a charging power to charge a battery device. A feedback circuit generates a feedback signal associated with the charging power for the power conversion circuit, wherein the power conversion circuit correspondingly adjusts the charging power according to the feedback signal. An identifier control circuit receives identifier information from the battery device. The identifier control circuit determines whether to control the feedback circuit to change the feedback signal according to the identifier information to dynamically adjust the charging power to adapt to the battery device. A low voltage trickle control circuit determines whether to control the feedback circuit to change the feedback signal according to a voltage of the charging power to cause the power conversion circuit to trickle charge the battery device. When the low voltage trickle control circuit controls the feedback circuit to change the feedback signal, the feedback circuit ignores control of the identifier control circuit.

Based on the above, the charging apparatus and the operating method thereof according to the embodiments of the invention can provide an adapted charging voltage and/or charging current according to different battery devices to achieve the effect of matching battery devices with different specifications. When the power storage of the battery device is overly low, the charging apparatus and the operating method thereof according to the embodiments of the invention can automatically provide a trickle current to the battery device to avoid overheating or damage to the battery device resulting from an overly large charging current.

BRIEF DESCRIPTION OF THE DRAWINGS

The accompanying drawings are included to allow further understanding of the embodiments of the invention, and the drawings are incorporated into the specification and form a part of the specification. The drawings illustrate the embodiments of the invention, and the drawings and the description together are used to interpret the principles of the invention.

DESCRIPTION OF THE EMBODIMENTS

Reference will now be made in detail to the exemplary embodiments of the invention, examples of which are illustrated in the accompanying drawings. Wherever possible, the same reference numbers are used in the drawings and the description to refer to the same or like parts.

Figure 1:
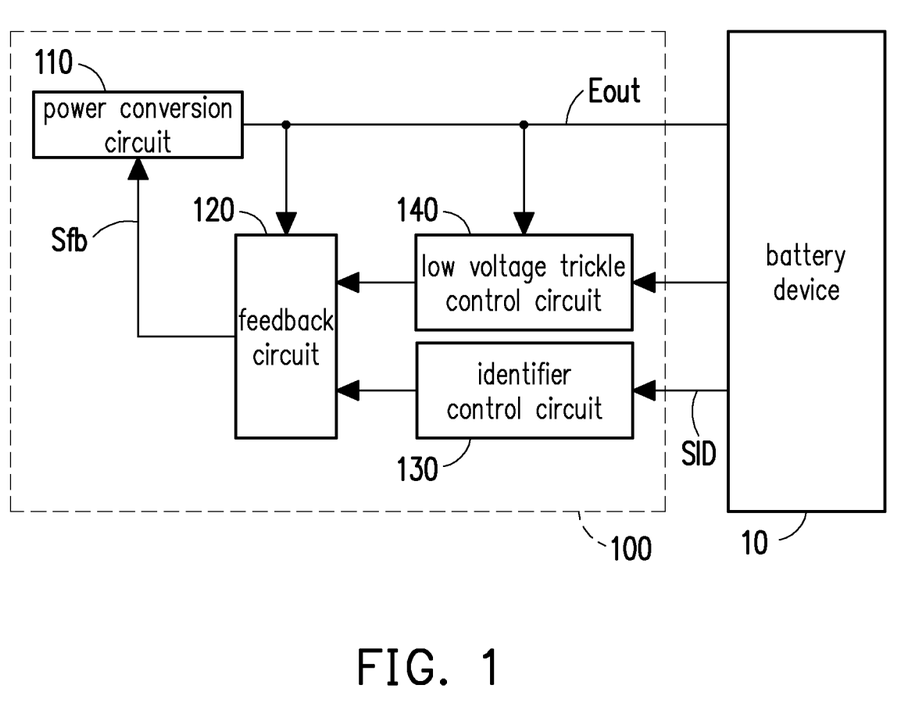
FIG. 1 is a circuit block diagram showing a charging apparatus according to an embodiment of the invention.

FIG. 1 is a circuit block diagram showing a charging apparatus according to an embodiment of the invention. Referring to FIG. 1, a charging apparatus 100 is configured to provide a charging power Eout to charge a battery device 10. The battery device 10 here refers to a rechargeable battery that can be reused after charging, such as the common lithium-ion (Li-ion) battery or nickel-metal hydride (Ni-MH) rechargeable battery. In some applied examples, the battery device 10 may be an electronic device or electro-mechanic device including the rechargeable battery. In the embodiment shown in FIG. 1, the charging apparatus 100 includes a power conversion circuit 110, a feedback circuit 120, an identifier control circuit 130, and a low voltage trickle control circuit 140. The function of the power conversion circuit 110 is to convert the power supply to provide the appropriate charging power Eout to the battery device 10 for charging. For example, according to the design requirements, the power conversion circuit 110 may be an AC-DC converter for converting an AC (Alternating Current) voltage into a DC (Direct Current) voltage. The AC-DC converter may be an existing AC-DC converter or an AC-DC converter of another type. According to the design requirements, the power conversion circuit 110 may also be a DC-DC converter, a DC-AC converter, or an AC-AC converter.

The feedback circuit 120 is coupled to the power conversion circuit 110 and is configured to generate a feedback signal Sfb associated with the charging power Eout and feed the feedback signal Sfb back to the power conversion circuit 110. According to the feedback signal Sfb of the feedback circuit 120, the power conversion circuit 110 correspondingly adjusts the voltage or current of the charging power Eout in real time. The feedback circuit 120 is configured to counteract changes in the charging power Eout to keep the output voltage or current of the power conversion circuit 110 stable.

Every battery device 10 may have different specification. The battery device 10 will provide identifier information SID based on its specification. The identifier control circuit 130 receives the identifier information SID from the battery device 10. According to the received identifier information SID, the identifier control circuit 130 can determine whether to control the feedback circuit 120 to change the feedback signal Sfb to cause the power conversion circuit 110 to dynamically adjust the charging power Eout in real time to adapt to the specification of the battery device 10. In other words, the identifier control circuit 130 indirectly affects the feedback signal Sfb generated by the feedback circuit 120 to adjust the power conversion circuit 110 to output a voltage suitable for the battery device 10.

Generally, when the power storage of the battery device 10 is overly low, the charging apparatus 100 will charge the battery device 10 with a large current (normal constant current mode). However, when the battery device 10 is in the dead battery state, if the charging apparatus 100 charges the battery device 10 (e.g., a Li-ion battery) with this large current, the charging apparatus 100 may cause the battery device 10 to overheat (or may even damage the battery device 10). In the present embodiment, the low voltage trickle control circuit 140 is designed to function when the battery device 10 is in the dead battery state so as to cause the power conversion circuit 110 to output a lower current (trickle) to charge the battery device 10.

The low voltage trickle control circuit 140 in FIG. 1 is coupled to the feedback circuit 120 and the power conversion circuit 110. The low voltage trickle control circuit 140 is configured to determine whether to control the feedback circuit 120 to change the feedback signal Sfb according to a voltage of the charging power Eout to cause the power conversion circuit 110 to trickle charge the battery device 10 (e.g., at 100 mA). In other words, the low voltage trickle control circuit 140 determines whether the battery device 10 is in the dead battery state based on the voltage of the charging power Eout. According to the dead battery state of the battery device 10, the low voltage trickle control circuit 140 indirectly affects the feedback signal Sfb generated by the feedback circuit 120 to adjust the current of the charging power Eout to be a trickle current that does not damage the battery device 10. It is noted that when the low voltage trickle control circuit 140 controls the feedback circuit 120 to change the feedback signal Sfb, the feedback circuit 120 ignores control of the identifier control circuit 130. In brief, the identifier control circuit 130 and the low voltage trickle control circuit 140 can both affect/control the feedback signal Sfb generated by the feedback circuit 120. However, in the case they both function, the control operation of the low voltage trickle control circuit 140 prevails over the control operation of the identifier control circuit 130.

Figure 2:
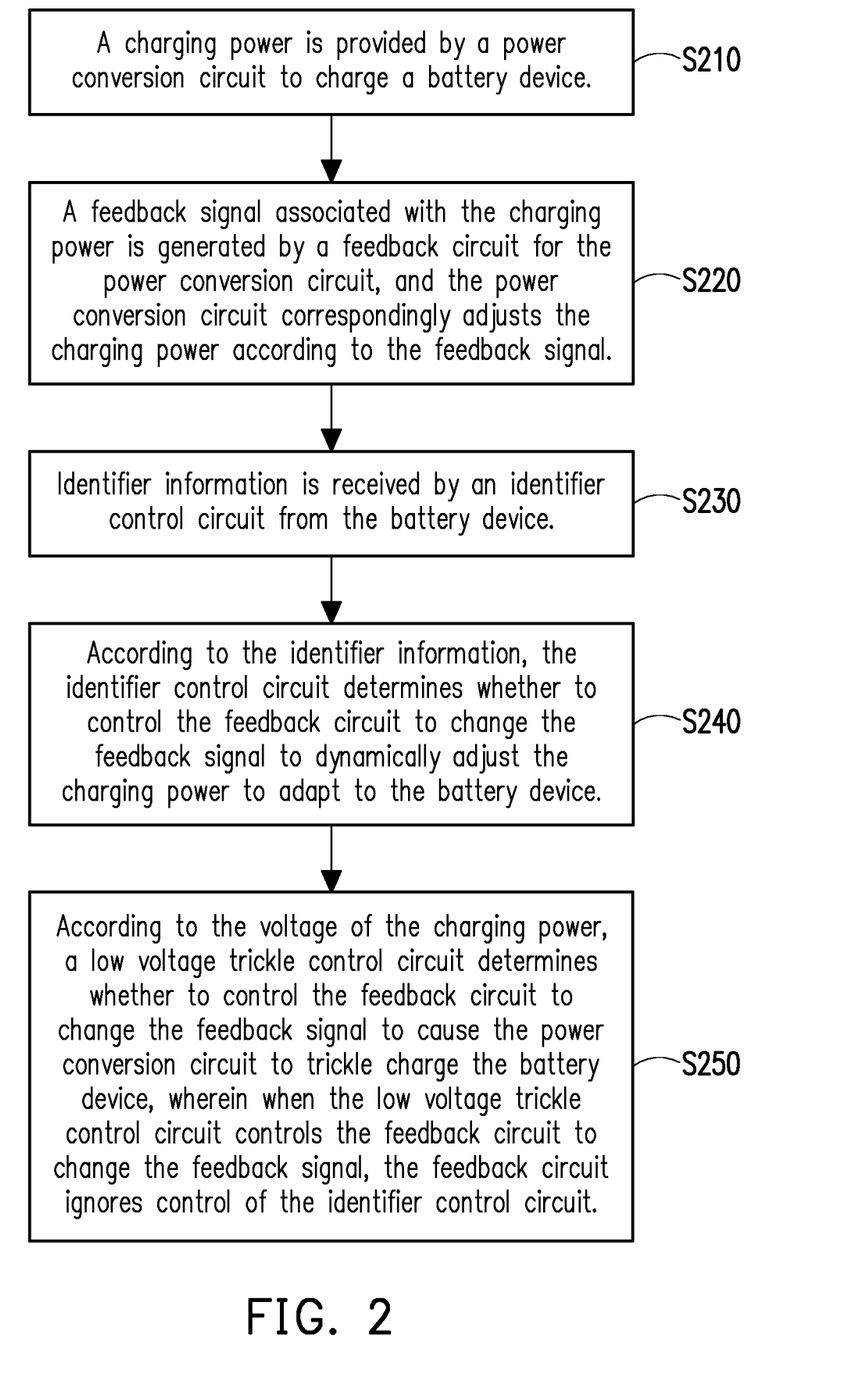
FIG. 2 is a flowchart showing the steps of an operating method of a charging apparatus according to an embodiment of the invention.

FIG. 2 is a flowchart showing the steps of an operating method of a charging apparatus according to an embodiment of the invention. Referring to both FIG. 1 and FIG. 2, first, in step S210, a charging power Eout is provided by the power conversion circuit 110 to charge the battery device 10. In step S220, a feedback signal Sfb associated with the charging power Eout is generated by the feedback circuit 120 for the power conversion circuit 110. According to the feedback signal Sfb, the power conversion circuit 110 correspondingly adjusts the charging power Eout. In step S230, identifier information SID is received by the identifier control circuit 130 from the battery device 10. In step S240, according to the identifier information SID, the identifier control circuit 130 determines whether to control the feedback circuit 120 to change the feedback signal Sfb to dynamically adjust the charging power Eout to adapt to the battery device 10. In step S250, according to a voltage of the charging power Eout, the low voltage trickle control circuit 140 determines whether to control the feedback circuit 120 to change the feedback signal Sfb to cause the power conversion circuit 110 to trickle charge the battery device 10. Specifically, when the low voltage trickle control circuit 140 controls the feedback circuit 120 to change the feedback signal Sfb, the feedback circuit 120 ignores control of the identifier control circuit 130.

Figure 3:
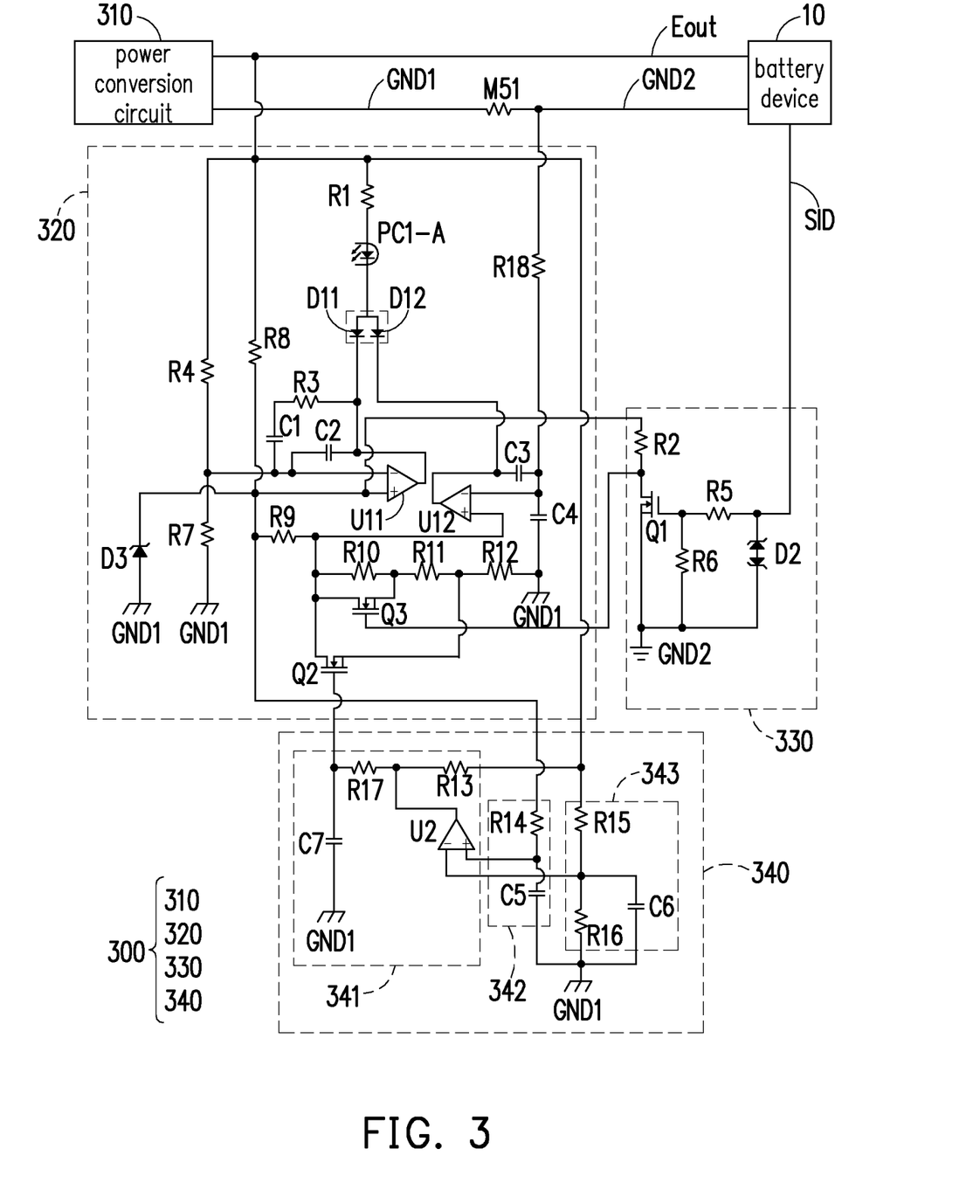
FIG. 3 is a circuit diagram showing a charging apparatus shown in FIG. 1 according to an embodiment of the invention.

FIG. 3 is a circuit diagram showing a charging apparatus shown in FIG. 1 according to an embodiment of the invention. Referring to FIG. 3, a charging apparatus 300 includes a power conversion circuit 310, a feedback circuit 320, an identifier control circuit 330, and a low voltage trickle control circuit 340. Reference may be made to the relevant description of the power conversion circuit 110 shown in FIG. 1 to analogously infer the power conversion circuit 310, which shall not be repeated here. Reference may be made to relevant descriptions of the feedback circuit 320, the identifier control circuit 330, and the low voltage trickle control circuit 340 shown in FIG. 3 for descriptions of the feedback circuit 120, the identifier control circuit 130, and the low voltage trickle control circuit 140 shown in FIG. 1.

Referring to FIG. 3, the feedback circuit 320 in the present embodiment mainly includes a comparator U11, a comparator U12, an optical coupler PC1-A, a diode D11, a diode D12, a pull-up resistor circuit, and a pull-down resistor circuit. The pull-up resistor circuit includes a resistor R8. The pull-down resistor circuit includes a pull-down resistor R10, a pull-down resistor R11, and a pull-down resistor R12. The first terminal and the second terminal of the pull-down resistor circuit are respectively coupled to the second terminal of the pull-up resistor circuit and a reference voltage (e.g., a ground voltage GND1). When neither the low voltage trickle control circuit 340 nor the identifier control circuit 330 controls the pull-down resistor circuit, the pull-down resistor circuit has a first resistance value. Based on the control of the identifier control circuit 330, the pull-down resistor circuit has a second resistance value. Based on the control of the low voltage trickle control circuit 340, the pull-down resistor circuit has a third resistance value. When the low voltage trickle control circuit 340 controls the pull-down resistor circuit, the pull-down resistor circuit ignores control of the identifier control circuit 330.

Specifically, the pull-down resistor circuit includes the pull-down resistor R10, the pull-down resistor R11, the pull-down resistor R12, a switch Q3, and a switch Q2. In the embodiment shown in FIG. 3, the switches Q2 and Q3 are metal-oxide-semiconductor field-effect transistors (MOSFETs). The first terminal of the pull-down resistor R10 is coupled to the second terminal of the pull-up resistor circuit (the second terminal of the resistor R8) via a resistor R9. The first terminal of the pull-down resistor R11 is coupled to the second terminal of the pull-down resistor R10. The second terminal of the pull-down resistor R11 is coupled to the reference voltage (e.g., the ground voltage GND1) via the pull-down resistor R12. The first terminal and the second terminal of the switch Q3 are respectively coupled to the first terminal and the second terminal of the pull-down resistor R10. The control terminal of the switch Q3 is controlled by the identifier control circuit 330. The first terminal and the second terminal of the switch Q2 are respectively coupled to the first terminal of the pull-down resistor R10 and the second terminal of the pull-down resistor R11. The control terminal of the switch Q2 is controlled by the low voltage trickle control circuit 340. When neither the low voltage trickle control circuit 340 nor the identifier control circuit 330 controls the pull-down resistor circuit (namely, when both the switch Q3 and the switch Q2 are turned off), the pull-down resistor circuit has the first resistance value (R10+R11+R12). When the identifier control circuit 330 controls the pull-down resistor circuit (namely, when the switch Q3 is turned on), the pull-down resistor circuit has the second resistance value (R11+R12). When the low voltage trickle control circuit 340 controls the pull-down resistor circuit (namely, when the switch Q2 is turned on), the pull-down resistor circuit has the third resistance value (R12). When the low voltage trickle control circuit 340 controls the pull-down resistor circuit, regardless of whether the identifier control circuit 330 controls the pull-down resistor circuit, the resistance value of the pull-down resistor circuit is maintained at the third resistance value (R12). In other words, the influence of the low voltage trickle control circuit 340 on the resistance value of the pull-down resistor circuit prevails over that of the identifier control circuit 330. When the low voltage trickle control circuit 340 controls the pull-down resistor circuit, the pull-down resistor circuit ignores control of the identifier control circuit 330.

The first terminal of the pull-up resistor circuit is coupled to the power conversion circuit 310 to receive the charging power Eout. The second terminal of the pull-up resistor circuit provides a divided voltage associated with the charging power Eout. Specifically, the output terminal of the comparator U11 is coupled to the cathode of the diode D11. The output terminal of the comparator U12 is coupled to the cathode of the diode D12. The anode of the diode D11 and the anode of the diode D12 are coupled to the cathode of a light emitting part of the optical coupler PC1-A. The anode of the light emitting part of the optical coupler PC1-A is coupled to the power conversion circuit 310 via a resistor R1 to receive the charging power Eout. A light receiving part (not shown) of the optical coupler PC1-A may be disposed in the power conversion circuit 310. The output terminal of the comparator U11 and the output terminal of the comparator U12 can affect the operation of the light emitting part of the optical coupler PC1-A, such that the light emitting part of the optical coupler PC1-A can emit a feedback signal Sfb (see the relevant description of FIG. 1) associated with the divided voltage to the power conversion circuit 310. The light receiving part (not shown) of the optical coupler PC1-A disposed in the power conversion circuit 310 senses the optical signal of the light emitting part of the optical coupler PC1-A to thereby affect the output of the power conversion circuit 310. The power conversion circuit 310 may be an existing converter or a power converter of another type, which shall not be repeatedly described here.

The first terminal of a resistor R4 is coupled to the power conversion circuit 310 to receive the charging power Eout. The second terminal of the resistor R4 is coupled to the first terminal of a resistor R7. The second terminal of the resistor R7 is coupled to the reference voltage (e.g., the ground voltage GND1). The inverting input terminal of the comparator U11 is coupled to the second terminal of the resistor R4. The first terminal of a capacitor C1 and the first terminal of a capacitor C2 are coupled to the inverting input terminal of the comparator U11. The first terminal of a resistor R3 is coupled to the second terminal of the capacitor C1. The second terminal of the resistor R3 and the second terminal of the capacitor C2 are coupled to the output terminal of the comparator U11. The non-inverting input terminal of the comparator U11 is coupled to the second terminal of the pull-up resistor circuit (the second terminal of the resistor R8) and the cathode of a Zener diode D3. The anode of the Zener diode D3 is coupled to the ground voltage GND1.

The first terminal of a resistor M51 is coupled to the power conversion circuit 310. The second terminal of the resistor M51 is coupled to the battery device 10. The first terminal of a resistor R18 is coupled to the second terminal of the resistor M51. The first terminal of a capacitor C4 is coupled to the second terminal of the resistor R18. The second terminal of the capacitor C4 is coupled to the reference voltage (e.g., the ground voltage GND1). The inverting input terminal of the comparator U12 is coupled to the second terminal of the resistor R18. The first terminal of a capacitor C3 is coupled to the inverting input terminal of the comparator U12. The second terminal of the capacitor C3 is coupled to the output terminal of the comparator U12. The non-inverting input terminal of the comparator U12 is coupled to the first terminal of the pull-down resistor circuit (the first terminal of the resistor R10).

The resistors R8 to R12 are combined in series. The non-inverting input terminal of the comparator U11 is coupled to the second terminal of the resistor R8 and the first terminal of the resistor R9. For the comparator U11, the resistor R8 forms the pull-up resistor circuit of the voltage-dividing resistor string, and the resistors R9 to R12 form the pull-down resistor circuit of the voltage-dividing resistor string. The non-inverting input terminal of the comparator U12 is coupled to the second terminal of the resistor R9 and the first terminal of the resistor R10. For the comparator U12, the resistors R8 to R9 form the pull-up resistor circuit of the voltage-dividing resistor string, and the resistors R10 to R12 form the pull-down resistor circuit of the voltage-dividing resistor string. According to the voltage division principle of the series resistors, the output of the comparator U11 and the comparator U12 is affected by the resistance value of the pull-down resistor circuit, and then the output of the comparator U11 and the comparator U12 affects the operation of the optical coupler PC1-A.

The identifier control circuit 330 includes a switch Q1, a resistor R2, a resistor R5, a resistor R6, and an electrostatic discharge protection member D2. In the present embodiment, the switch Q1 is a MOSFET, and the electrostatic discharge protection member D2 is a limiter composed of two back-to-back Zener diodes. The first terminal of the resistor R2 is coupled to a first voltage (e.g., the voltage of the charging power Eout) via the resistor R8. The second terminal of the resistor R2 is coupled to the control terminal of the switch Q3 to control the switch Q3. Since whether the switch Q3 is turned on affects the feedback signal (the optical signal emitted by the light emitting part of the optical coupler PC1-A, i.e., the feedback signal Sfb shown in FIG. 1) of the feedback circuit 320, namely, the second terminal of the resistor R2 also controls the feedback circuit 320. The first terminal of the switch Q1 is coupled to the second terminal of the resistor R2. The second terminal of the switch Q1 is coupled to a second voltage (e.g., a ground voltage GND2). The first terminal of the resistor R5 is coupled to the control terminal of the switch Q1. The second terminal of the resistor R5 is coupled to the battery device 10 to receive the identifier information SID. Therefore, the control terminal of the switch Q1 is controlled by the identifier information SID of the battery device 10 via the resistor R5. The first terminal of the resistor R6 is coupled to the first terminal of the resistor R5. The second terminal of the resistor R6 is coupled to the second voltage (e.g., the ground voltage GND2). The first terminal of the electrostatic discharge protection member D2 is coupled to the second terminal of the resistor R5. The second terminal of the electrostatic discharge protection member D2 is coupled to the second voltage (e.g., the ground voltage GND2). Therefore, when an electrostatic surge occurs, the electrostatic discharge protection member D2 will be broken down to guide the electrostatic surge to the ground and thereby achieve the effect of electrostatic discharge protection.

Due to the presence of the feedback circuit 320, the power conversion circuit 310 can output stable voltages and currents. The identifier control circuit 330 can affect the feedback signal (the optical signal emitted by the light emitting part of the optical coupler PC1-A, i.e., the feedback signal Sfb shown in FIG. 1) of the feedback circuit 320 via the comparator U11 to further adjust the voltage and/or current of the charging power Eout of the power conversion circuit 310. The adjustment of the charging voltage is first described below. When the identifier information SID is low, the switch Q1 is turned off. At this time, the switch Q3 is turned on, which decreases the resistance value of the pull-down resistor circuit, namely, pulling down the voltage of the non-inverting input terminal of the comparator U11. Therefore, the output voltage of the comparator U11 drops, which causes the voltage of the charging power Eout of the power conversion circuit 310 to rise. When the identifier information SID is high, the switch Q1 is turned on and the switch Q3 is turned off. At this time, the resistance value of the pull-down resistor circuit is pulled up and, namely, the voltage of the non-inverting input terminal of the comparator U11 is pulled up. Therefore, the output voltage of the comparator U11 rises, which causes the voltage of the charging power Eout of the power conversion circuit 310 to drop.

Next, the adjustment of the charging current is described. Referring to FIG. 3 again, the resistor M51 has a small resistance value. The first terminal of the resistor M51 is coupled to the power conversion circuit 310, and the second terminal of the resistor M51 is coupled to the battery device 10. The voltage drop across the two terminals of the resistor M51 reflects the charge current. Therefore, the inverting input terminal of the comparator U12 can detect the charging current (the current flowing through the resistor M51). The non-inverting input terminal of the comparator U12 is coupled to the first terminal of the pull-down resistor circuit of the voltage-dividing resistor string (the first terminal of the resistor R10), and the resistance value of the pull-down resistor circuit is controlled by whether the switch Q3 is turned on. When the identifier information SID is low, the switch Q1 is turned off. At this time, the switch Q3 is turned on, which decreases the resistance value of the pull-down resistor circuit. Therefore, the current of the charging power Eout of the power conversion circuit 310 decreases. In contrast, when the identifier information SID is high, the switch Q1 is turned on and the switch Q3 is turned off, which increases the resistance value of the pull-down resistor circuit. Therefore, the current of the charging power Eout of the power conversion circuit 310 increases.

In summary, every battery device 10 may have different specification, the battery device 10 will provide identifier information SID based on its specification. According to the different identifier information SID, the identifier control circuit 330 can turn off or turn on the switch Q3 and thereby affects the feedback signal of the feedback circuit 320, such that the voltage and current of the charging power Eout of the power conversion circuit 310 can be adjusted according to the requirement of the battery device 10.

Referring to FIG. 3 again, the low voltage trickle control circuit 340 includes a voltage detecting circuit 343, a voltage generating circuit 342, and a voltage comparing circuit 341. The voltage generating circuit 342 includes a resistor R14 and a capacitor C5. The first terminal of the resistor R14 is coupled to the first voltage (e.g., the voltage of the charging power Eout) via resistor R8. The second terminal of the resistor R14 is coupled to the voltage comparing circuit 341 to provide a threshold voltage to the voltage comparing circuit 341. The first terminal of the capacitor C5 is coupled to the second terminal of the resistor R14. The second terminal of the capacitor C5 is coupled to the second voltage (e.g., the ground voltage GND1). The voltage detecting circuit 343 is coupled to the power conversion circuit 310. The voltage detecting circuit 343 is configured to detect the charging power Eout and obtain a detecting voltage. The voltage comparing circuit 341 is coupled to the voltage detecting circuit 343 to receive the detecting voltage. The voltage comparing circuit 341 is configured to compare the detecting voltage with the threshold voltage to obtain a comparison result. According to the comparison result, the voltage comparing circuit 341 determines whether to control the feedback circuit 320 to change the feedback signal (the optical signal emitted by the light emitting part of the optical coupler PC1-A, i.e., the feedback signal Sfb shown in FIG. 1).

The voltage detecting circuit 343 includes a resistor R15, a resistor R16, and a capacitor C6. The first terminal of the resistor R15 is coupled to the first voltage (e.g., the voltage of the charging power Eout). The second terminal of the resistor R15 is coupled to the voltage comparing circuit 341 to provide the detecting voltage. The first terminal of the resistor R16 is coupled to the second terminal of the resistor R15. The second terminal of the resistor R16 is coupled to the second voltage (e.g., the ground voltage GND1). Two terminals of the capacitor C6 are respectively coupled to the second terminal of the resistor R16 and the second voltage. Therefore, the voltage detecting circuit 343 can detect the voltage of the charging power Eout to provide the detecting voltage to the voltage comparing circuit 341.

The voltage comparing circuit 341 of the low voltage trickle control circuit 340 includes a comparator U2, a resistor R13, a resistor R17, and a capacitor C7. The first terminal of the resistor R13 is coupled to the first voltage (e.g., the voltage of the charging power Eout). The second terminal of the resistor R13 is coupled to the output terminal of the comparator U2. The first terminal of the resistor R17 is coupled to the second terminal of the resistor R13. The second terminal of the resistor R17 is coupled to the control terminal of the switch Q2 to control the feedback circuit 320. The first terminal of the capacitor C7 is coupled to the second terminal of the resistor R17. The second terminal of the capacitor C7 is coupled to the second voltage (e.g., the ground voltage GND1). The first input terminal (e.g., the non-inverting input terminal) of the comparator U2 is coupled to the second terminal of the resistor R14 to receive the threshold voltage. The second input terminal (e.g., the inverting input terminal) of the comparator U2 is coupled to the voltage detecting circuit 343 (the first terminal of the resistor R16) to receive the detecting voltage. The comparator U2 compares the voltage of its non-inverting input terminal with the voltage of its inverting input terminal to obtain a comparison result. According to the comparison result, the voltage comparing circuit 341 can determine whether to control the feedback circuit 320 to change the feedback signal (the optical signal emitted by the light emitting part of the optical coupler PC1-A, i.e., the feedback signal Sfb shown in FIG. 1).

Specifically, when the power storage of the battery device 10 is overly low such that the voltage of the charging power Eout is lower than a predetermined reference point voltage, the switch Q2 is turned on, which further pulls down the resistance value of the pull-down resistor circuit and decreases the current of the charging power Eout of the power conversion circuit 310, namely, decreasing the current of the charging power Eout to the extent of a "trickle" (e.g., 100 mA).

Based on the power storage of the battery device 10, the low voltage trickle control circuit 140 can decrease the current of the charging power Eout to the extent of a "trickle" through the power conversion circuit 110 to avoid heating or damage to the battery device 10 resulting from an overly large charging current. Based on the specification of the battery device 10 (i.e., based on the identifier information SID), the identifier control circuit 130 can dynamically adjust the level of the voltage of the charging power Eout in real time through the power conversion circuit 110 to adapt to the specification of the battery device 10. It is noted that, when the low voltage trickle control circuit 140 controls the feedback circuit 120, the feedback circuit 120 ignores control of the identifier control circuit 130.

Lastly, it shall be noted that the foregoing embodiments are meant to illustrate, rather than limit, the technical solutions of the embodiments of the invention. Although the invention has been detailed with reference to the foregoing embodiments, persons ordinarily skilled in the art shall be aware that they may still make modifications to the technical solutions recited in the foregoing embodiments or make equivalent replacements of part or all of the technical features therein, and these modifications or replacements do not cause the nature of the corresponding technical solutions to depart from the scope of the technical solutions of the embodiments of the invention.

What is claimed is:

1. A charging apparatus configured to charge a battery device, the charging apparatus comprising:
   a power conversion circuit configured to provide a charging power to charge the battery device;
   a feedback circuit coupled to the power conversion circuit and configured to generate a feedback signal associated with the charging power for the power conversion circuit, wherein the power conversion circuit correspondingly adjusts the charging power according to the feedback signal;
   an identifier control circuit coupled to the feedback circuit and configured to receive identifier information from the battery device and determine whether to control the feedback circuit to change the feedback signal according to the identifier information to dynamically adjust the charging power to adapt to the battery device; and
   a low voltage trickle control circuit coupled to the feedback circuit and the power conversion circuit and configured to determine whether to control the feedback circuit to change the feedback signal according to a voltage of the charging power to cause the power conversion circuit to trickle charge the battery device,
   wherein when the low voltage trickle control circuit controls the feedback circuit to change the feedback signal, the feedback circuit ignores control of the identifier control circuit,
   wherein the low voltage trickle control circuit comprises:
      a voltage detecting circuit coupled to the power conversion circuit and configured to detect the charging power to obtain a detecting voltage; and
      a voltage comparing circuit coupled to the voltage detecting circuit to receive the detecting voltage and configured to compare the detecting voltage with a threshold voltage to obtain a comparison result, wherein the voltage comparing circuit determines whether to control the feedback circuit to change the feedback signal according to the comparison result.

2. The charging apparatus according to claim 1, wherein the feedback circuit comprises:
   a pull-up resistor circuit comprising a first terminal coupled to the power conversion circuit to receive the charging power, wherein a second terminal of the pull-up resistor circuit provides a divided voltage associated with the charging power; and
   a pull-down resistor circuit comprising a first terminal and a second terminal respectively coupled to the second terminal of the pull-up resistor circuit and a reference voltage, wherein
   when neither the low voltage trickle control circuit nor the identifier control circuit controls the pull-down resistor circuit, the pull-down resistor circuit has a first resistance value,
   the pull-down resistor circuit has a second resistance value based on control of the identifier control circuit,
   the pull-down resistor circuit has a third resistance value based on control of the low voltage trickle control circuit, and
   when the low voltage trickle control circuit controls the pull-down resistor circuit, the pull-down resistor circuit ignores control of the identifier control circuit.

3. The charging apparatus according to claim 2, wherein the pull-down resistor circuit comprises:
   a first pull-down resistor comprising a first terminal coupled to the second terminal of the pull-up resistor circuit;
   a second pull-down resistor comprising a first terminal coupled to a second terminal of the first pull-down resistor, wherein a second terminal of the second pull-down resistor is coupled to the reference voltage;
   a first switch comprising a first terminal and a second terminal respectively coupled to the first terminal and the second terminal of the first pull-down resistor, wherein a control terminal of the first switch is controlled by the identifier control circuit; and
   a second switch comprising a first terminal and a second terminal respectively coupled to the first terminal of the first pull-down resistor and the second terminal of the second pull-down resistor, wherein a control terminal of the second switch is controlled by the low voltage trickle control circuit.

4. The charging apparatus according to claim 1 wherein the identifier control circuit comprises:
   a first resistor comprising a first terminal coupled to a first voltage, wherein a second terminal of the first resistor controls the feedback circuit; and
   a switch comprising a first terminal and a second terminal respectively coupled to the second terminal of the first resistor and a second voltage, wherein a control terminal of the switch is controlled by the identifier information of the battery device.

5. The charging apparatus according to claim 4, wherein the identifier control circuit further comprises:
   a second resistor comprising a first terminal coupled to the control terminal of the switch, wherein a second terminal of the second resistor is coupled to the battery device to receive the identifier information; and
   a third resistor comprising a first terminal coupled to the first terminal of the second resistor, wherein a second terminal of the third resistor is coupled to the second voltage.

6. The charging apparatus according to claim 5, wherein the identifier control circuit further comprises:
   an electrostatic discharge protection member comprising a first terminal coupled to the second terminal of the second resistor, wherein a second terminal of the electrostatic discharge protection member is coupled to the second voltage.

7. The charging apparatus according to claim 1, wherein the voltage comparing circuit comprises:
   a comparator comprising a first input terminal for receiving the threshold voltage, wherein a second input terminal of the comparator is coupled to the voltage detecting circuit to receive the detecting voltage;
   a first resistor comprising a first terminal coupled to a first voltage, wherein a second terminal of the first resistor is coupled to an output terminal of the comparator;
   a second resistor comprising a first terminal coupled to the second terminal of the first resistor, wherein a second terminal of the second resistor controls the feedback circuit; and
   a capacitor comprising a first terminal and a second terminal respectively coupled to the second terminal of the second resistor and a second voltage.

8. The charging apparatus according to claim wherein the voltage detecting circuit comprises:
   a first resistor comprising a first terminal coupled to a first voltage, wherein a second terminal of the first resistor is coupled to the voltage comparing circuit to provide the detecting voltage;
   a second resistor comprising a first terminal coupled to the second terminal of the first resistor, wherein a second terminal of the second resistor is coupled to a second voltage; and
   a capacitor comprising a first terminal and a second terminal respectively coupled to the second terminal of the first resistor and the second voltage.

9. The charging apparatus according to claim 1, wherein the low voltage trickle control circuit further comprises:
   a resistor comprising a first terminal coupled to a first voltage, wherein a second terminal of the resistor is coupled to the voltage comparing circuit to provide the threshold voltage; and
   a capacitor comprising a first terminal and a second terminal respectively coupled to the second terminal of the resistor and a second voltage.

10. An operating method of a charging apparatus configured to charge a battery device, the operating method comprising:
    providing, by a power conversion circuit, a charging power to charge the battery device;
    generating, by a feedback circuit, a feedback signal associated with the charging power for the power conversion circuit, wherein the power conversion circuit correspondingly adjusts the charging power according to the feedback signal;
    receiving, by an identifier control circuit, identifier information from the battery device;
    determining, by the identifier control circuit, whether to control the feedback circuit to change the feedback signal according to the identifier information to dynamically adjust the charging power to adapt to the battery device; and
    determining, by a low voltage trickle control circuit, whether to control the feedback circuit to change the feedback signal according to a voltage of the charging power to cause the power conversion circuit to trickle charge the battery device,
    wherein when the low voltage trickle control circuit controls the feedback circuit to change the feedback signal, the feedback circuit ignores control of the identifier control circuit,
    wherein the step of determining whether to control the feedback circuit to change the feedback signal according to the voltage of the charging power to cause the power conversion circuit to trickle charge the battery device comprises:
      detecting the charging power to obtain a detecting voltage;
      comparing the detecting voltage with a threshold voltage to obtain a comparison result; and
      determining whether to control the feedback circuit to change the feedback signal according to the comparison result.

* * * * *